United States Patent [19]

Smith et al.

[11] Patent Number: 5,402,358

[45] Date of Patent: Mar. 28, 1995

[54] METHOD AND STRUCTURE FOR THE AUTOMATED DESIGN OF ANALOG INTEGRATED CIRCUITS

[75] Inventors: Michael J. S. Smith, Honolulu, Hi.; Clemenz L. Portmann, San Jose, Calif.

[73] Assignee: VLSI Technology, Inc., San Jose, Calif.

[21] Appl. No.: 147,465

[22] Filed: Oct. 29, 1993

Related U.S. Application Data

[63] Continuation of Ser. No. 933,592, Aug. 20, 1992, abandoned, which is a continuation of Ser. No. 523,453, May 14, 1990, abandoned.

[51] Int. Cl.$^6$ .............................................. G06F 15/60
[52] U.S. Cl. .................................... 364/490; 364/489; 364/488
[58] Field of Search ................. 364/488, 489, 490, 491

[56] References Cited

U.S. PATENT DOCUMENTS

| | | | |
|---|---|---|---|
| T940,013 | 11/1975 | Ho | 364/489 |
| 4,933,860 | 6/1990 | Liu | 364/490 |
| 4,967,367 | 10/1990 | Piednoir | 364/490 |

OTHER PUBLICATIONS

IEEE Journal of Solid–State Circuits, vol. 24, No. 5, Oct. 1989 Cell Libraries and Assembly Tools for Analog/Digital CMOS and BiCMOS Application-Specific Integrated Circuit Design by M. Smith et al.

H. Heeb and W. Fichtner, GRAPES: A Module Generator Based on Graph Planarity, Nov. 1987, pp. 428–431.

R. J. Duffin, Toplogy of series–parallel networks, 1965, pp. 308–318.

S. Chakravarty et al, On Optimizing nMos and Dynamic CMOS Functional Cells, 1990, pp. 1701–1704.

C. Hwant, Y. Hateh, et al, An Optimal Transistor--Chaining Algorithm for CMOS Cell Layout, 1989, pp. 344, 347.

A. Domic et al, CLEO: a CMOS layout generator, Nov. 1989, pp. 340–343.

Y. M. Hunag and M. Sarrafzadeh, Parallel Algorithmy for Mimimum dual–cover with applications to CMOS layout, Aug. 1988, pp. 26–33.

D. Hill, Sc2:A Hybrid Automatic Layout System, Nov. 1985, pp. 172–174.

R. L. Maziasz et al, Layout Optimization of Static CMOS Functional Cells, Jul. 1990, pp. 708–719.

H. Cai, S. Note et al, A Data Path Layout Assembler for High Performance DSP Circuits, 1990, pp. 306–311.

N. Matsumoto, Y. Watanabe et al, Datapath Generator Based on Gate–Level Symbolic Layout, 1990, pp. 388–393.

T. Lager, Lager IV Tools Users Manual, On–Line Documentation for Public Domain UC Berkeley CAD Tools, Jun. 1990, pp. 1–3, Rev. 2.0.

T. Lager IV, Release 3.1, Lager IV Tools Users Manual, On–Line Documentation, Nov. 1991, pp. 1–10.

(List continued on next page.)

*Primary Examiner*—Vincent N. Trans
*Attorney, Agent, or Firm*—Hickman & Beyer

[57] ABSTRACT

A method for creating a physical layout of an analog integrated circuit characterized by the steps of developing a library of device modules and then assembling the device modules in an iterative fashion to create the desired analog circuit. The iterative process is preferably performed in a computerized spreadsheet program by developing an initial tiling script for the device modules, calculating the operating specifications of the circuit produced by the tiling script, comparing the calculated operating specifications against the desired operating parameters of the circuit and modifying the tiling script and repeating the process until the calculated operating specifications meet the desired operating parameters. In one embodiment the desired operating parameters include operating parameters of the analog circuit taken as a whole and in another embodiment the desired operating parameters include operating parameters of individual devices within the analog circuit. The device modules may be combined in a variety of fashions to make transistors and other devices of various operating specifications.

8 Claims, 11 Drawing Sheets

OTHER PUBLICATIONS

A. R. Newton, Symbolic Layout and Procedural Design, 1987, pp. 65–113.

Design Methodologies for VLSI Systems, Analog Digital ASIC Design, pp. 60–61.

Successful ASIC Design the First Time Through, Van Nostrand Reinhold, 1991, p. 18.

S. Wimer, R. Pinter, Optimal Chaining of CMOS Transistors in a Functional Cell, 1987, pp. 795–801.

G. Thuau, G. Saucier, Optimized Layout of MOS Cells, 1988, pp. 79–87.

VLSI Technology, Inc. VLSIslice Silicon Compiler Language and Development Tool, 14 Mar. 1991, pp. 1–89.

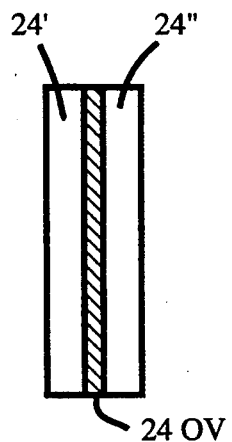
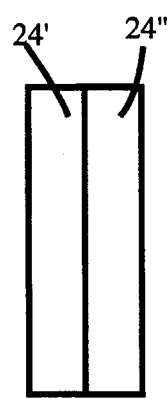
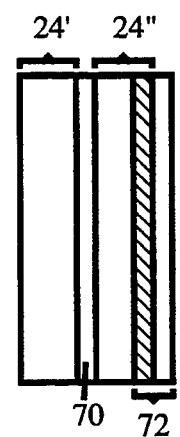
Fig. 7a  Fig. 7b  Fig. 7c
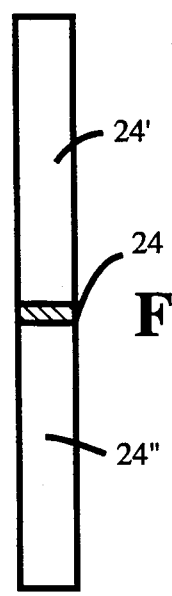
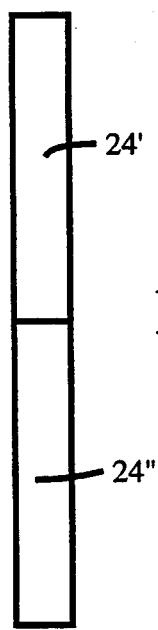
Fig. 7d  Fig. 7e

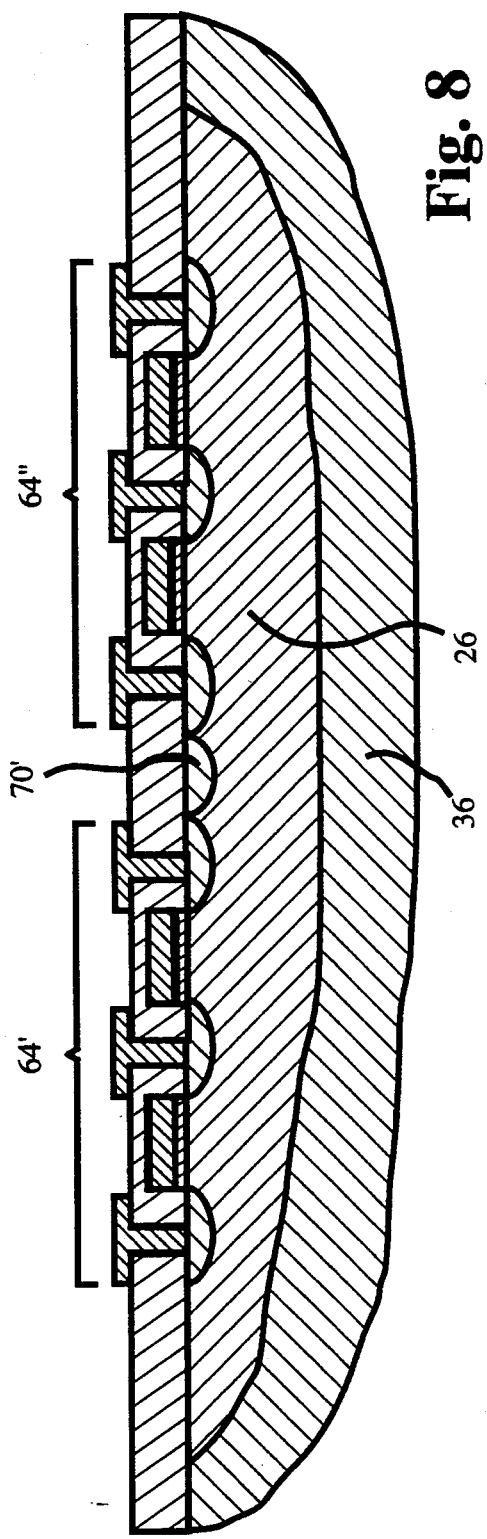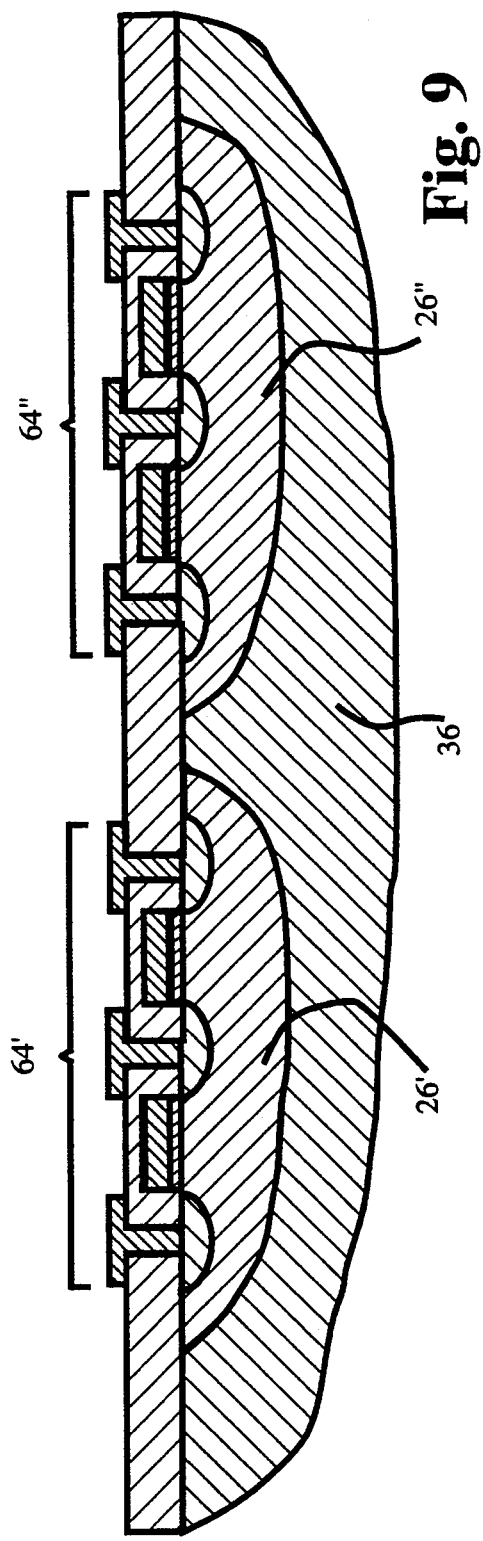

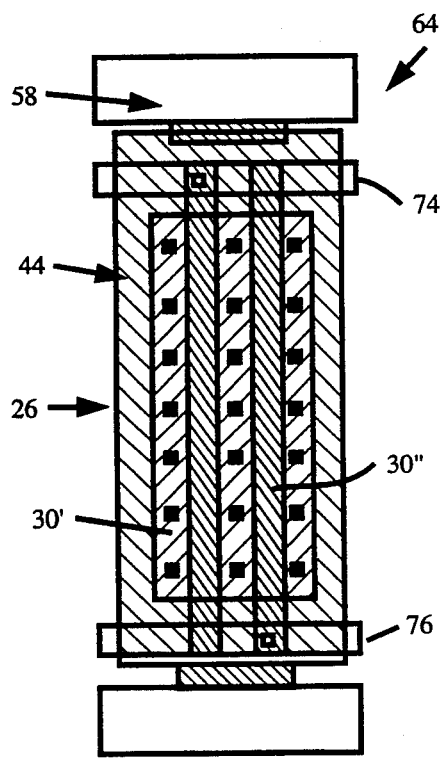
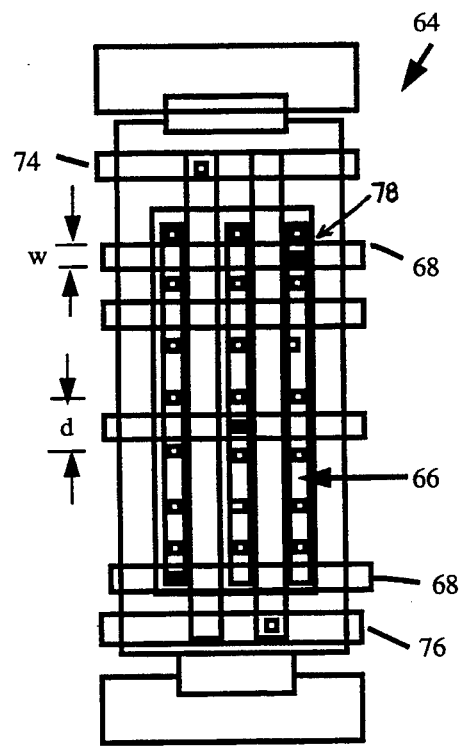
Fig. 10     Fig. 11
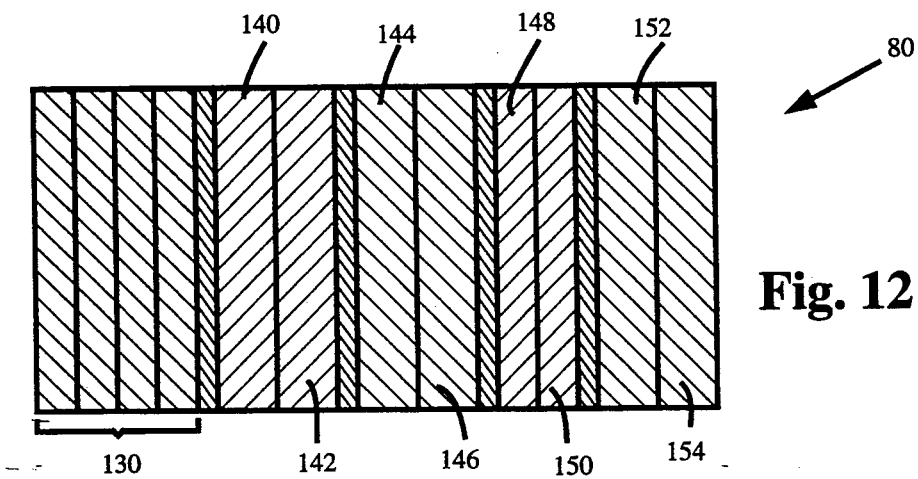
Fig. 12

METHOD AND STRUCTURE FOR THE AUTOMATED DESIGN OF ANALOG INTEGRATED CIRCUITS

This is a continuation of application Ser. No. 07/933,592, filed Aug. 20, 1992, now abandoned, which is a continuation of application Ser. No. 07/523,453, filed on May 14, 1990, now abandoned.

BACKGROUND OF THE INVENTION

This invention relates generally to the design of integrated circuits and more particularly to the automated design of analog integrated circuits.

As integrated circuits (ICs) have grown larger and more complex there has been an increasing trend to automate their design. This is particularly the case with application-specific integrated circuits (ASICs) which are semi-custom ICs designed to a customer's specifications. ASICs include gate arrays in which only the metallization masks are different for each ASIC design, standard cells in which all of the mask layers are customized, and hybrid combinations of the two. Typically, automated design programs utilizing libraries of existing circuits are used to design the custom masks of ASICs.

Automation of the design process for digital integrated circuits is relatively well developed. The high density, cell uniformity, and repeatability of digital circuitry is well adapted to automated design process and, in consequence, there are many useful software tools available to aid in digital IC design. In contrast, analog circuitry has a more irregular topology, a much greater range of device sizes and typically greater circuit complexity, rendering tools made for automated digital design generally inapplicable. In consequence, the design tools for analog or analog/digital circuitry are frequently crude or not available.

A traditional, prior art method for automated analog IC design is shown in FIG. 1. First, the system specifications for the IC are chosen and then a block diagram of the individual circuits within the system is developed. Next, the individual circuit specifications are chosen and the individual circuits are designed. As indicated by the return arrow, this is an iterative process where tentative designs for the individual circuits are compared against their specifications and repeatedly modified as necessary to meet these specifications. Once the circuit design has been completed, the entire system is simulated in a simulator such as SPICE (originally designed at the University of California at Berkeley). If the system does not meet specifications, the individual circuit specifications are modified and the circuit design step is repeated. Finally, the circuit layout is compared against the system specifications which may result in additional modifications to the individual circuit specifications and designs.

A problem with this prior art design method is that it is an iterative process requiring a number of distinct design tools and substantial human intervention. Each of the design steps shown in FIG. 1 is typically performed using a different set of software tools and the result of each step must be evaluated by an experienced system designer to determine whether an iterative redesign step is required. The prior art process is therefore quite wasteful of human and machine resources and, in consequence, is a slow and expensive solution to analog IC design.

Another reason that digital design tools have not been adapted for use in designing analog or analog/digital circuitry is that digital device modules for devices such as transistors are very inefficient when they are enlarged to handle the higher currents required by analog circuitry. Typically, digital device modules are made as small as possible to maximize their switching speed and to minimize their power requirements. In consequence, the metal interconnections between digital device modules are between modules rather than over the modules. This design methodology turns out to be very inefficient with analog circuitry. Also, digital device modules are not designed for the production of transistor devices of varying sizes and current capabilities.

Since digital design tools are not particularly useful in analog IC design and since conventional analog design tools tend to be crude, slow and expensive, complex analog or analog/digital ASIC designs are an expensive and infrequently used option. What the prior art fails to provide, then, is an analog design tool which permits the rapid, inexpensive and automated assembly of analog and analog/digital circuits with efficient and scalable device modules.

SUMMARY OF THE INVENTION

With the novel device modules and iterative design processes of the present invention analog and analog/digital circuits can be rapidly and inexpensively designed and assembled. Furthermore, the device modules of the present invention are designed with scalable design rules permitting the rapid scaling of analog designs to accommodate different process geometries.

The design process of the present invention includes an iterative tiling script program which preferably runs in a spreadsheet environment. The program designs an initial tiling script and then calculates the expected performance of the circuit produced by the script. The expected performance is compared to the desired operating parameters of the analog or analog/digital circuit and the tiling script is modified as necessary in an iterative design process. Unlike prior art design methods, all design iteration is performed within the tiling script program.

One device module of the present invention is a MOSFET transistor including a source region, a drain region and a channel region. Vias through an overlying first insulating layer connect the source region and the drain region to first-level conductive lines or straps. The vias are sufficiently spaced such that transversely extending second-level conductive lines or straps pass between adjacent pairs of vias. The second-level conductive lines may selectively contact the first-level conductive lines with vias which fit between the vias of the first-level conductive lines. This construction permits interconnecting lines between the device modules to pass over the modules, allowing higher density analog circuitry. The device modules are also designed so that they can be overlapped or abutted to create device modules of various sizes and current capacities as required by the analog circuitry.

These and other advantages of the present invention will become apparent to those skilled in the art upon a reading of the following specifications and a study of the several figures of the drawing.

BRIEF DESCRIPTION OF THE DRAWINGS

FIGS. 7a-7e illustrate various device modules formed from more basic device modules such as the device module shown in FIG. 3;

FIG. 8 illustrates the connection of two device modules of FIG. 5 with a common well;

FIG. 9 illustrates the connection of two device modules of FIG. 5 with separate wells;

FIG. 10 is a top plan view of the device module of FIG. 5 with conductive gate straps in place;

FIG. 11 is a top plan view of the device of FIG. 10 with conductive, interconnecting cross-straps in place;

FIG. 12 illustrates a number of device modules assembled ("tiled") into a portion of an integrated circuit;

DETAILED DESCRIPTION OF THE PREFERRED EMBODIMENTS

Figure 1:
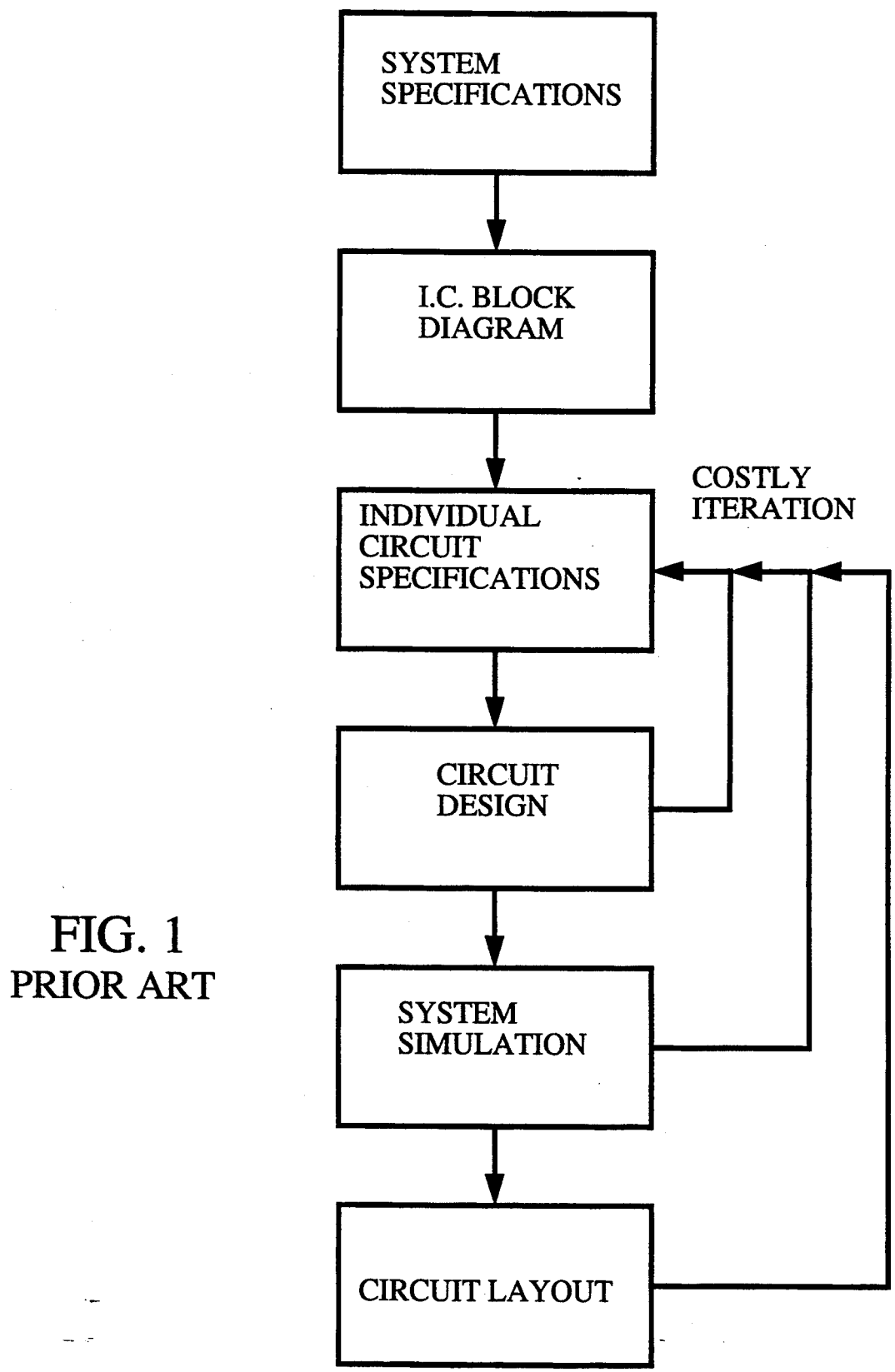
FIG. 1 is a flow diagram of a prior art method for designing analog and analog/digital integrated circuits.
Figure 2:
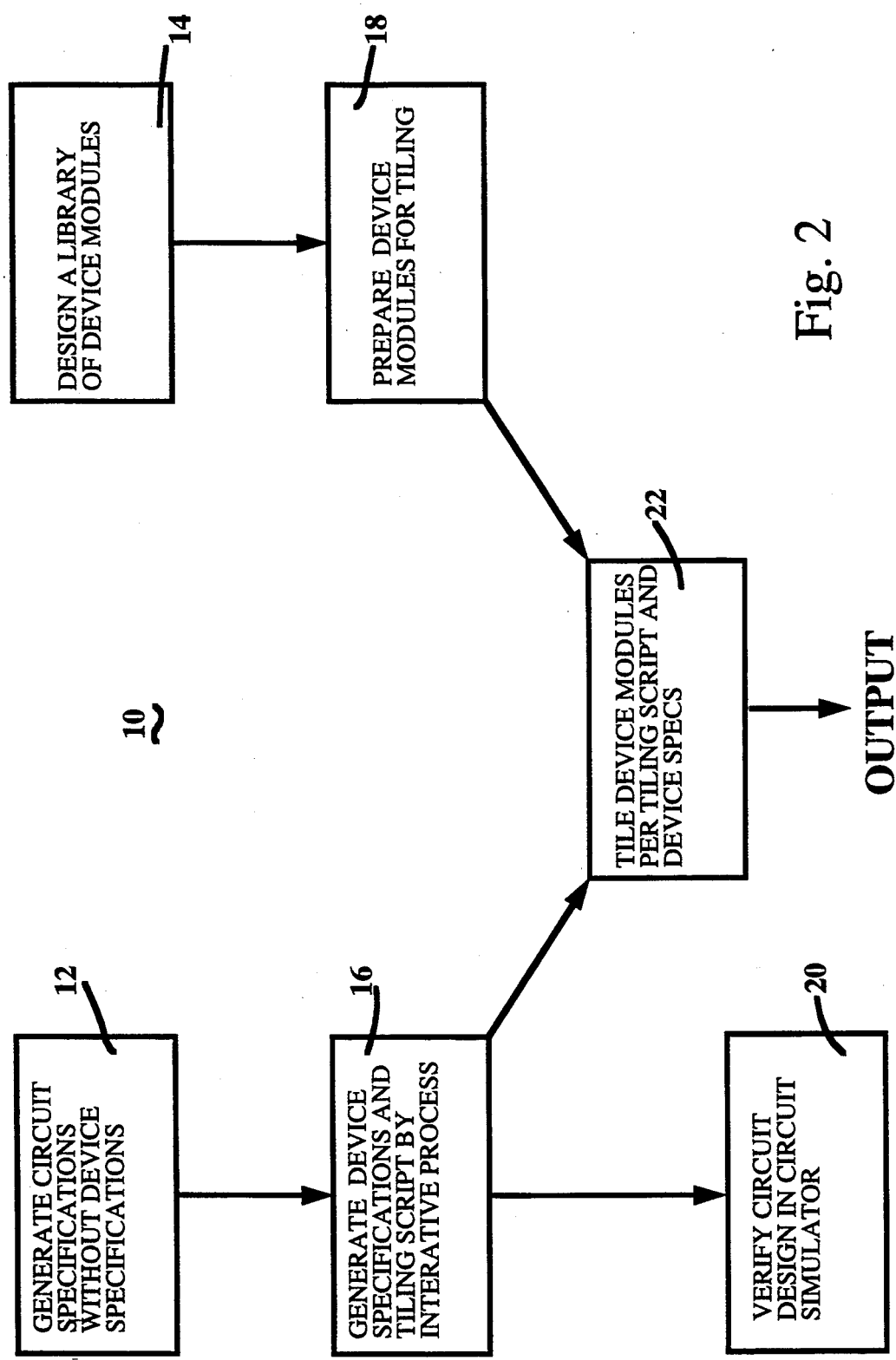
FIG. 2 is a flow diagram of a method for designing analog and analog/digital integrated circuits in accordance with the present invention.

As described previously, FIG. 1 is a flow diagram of a prior art process for designing analog and analog/digital integrated circuits. FIG. 2 is a flow diagram illustrating a process for designing analog and analog/digital circuits in accordance with the present invention.

In FIG. 2, the process 10 includes the steps of generating circuit specifications in step 12, designing a library of device modules in step 14, generating device specifications and a tiling script in step 16, preparing the device modules for tiling in step 18, verifying the circuit design in a design simulator in step 20, and tiling the device modules in a step 22.

The generation of the, circuit specification of step 12 takes a schematic of a desired circuit and processes the schematic to produce an "empty" netlist, i.e. a netlist of devices within the circuit without actual size specifications assigned to the devices. For example, an N-channel MOSFET may be specified in the netlist without specifying its width or length. In consequence, at this point the current capabilities or gain of the device is unknown. Several commercially available software products are capable of converting a schematic into an empty netlist, including SPICE_NET provided by IntuSoft of San Diego, Calif. and VLSIschematic provided by VLSI Technology of San Jose, Calif.

The analog circuit layout is based upon the library of device modules developed in step 14. A designer produces one or more device module designs which are converted into device modules by specialized software programs such as the commercially available UCB magic layout editor developed at the University of California at Berkeley, Berkeley, Calif. The UCB magic layout editor produces compact modules with interactive design role checking by using generic layout rules for scalable analog design. These rules are compatible with the U.S. Government's MOS Implementation Service (MOSIS) and allow for two layers of polysilicon and npn devices in a BiCMOS process.

In step 18 the device modules are prepared for tiling by standardizing interconnection points and by providing alignment means known as abutment boxes. A commercially available software package capable of such module preparation is VLSIlayout produced by VLSI Technology, Inc. of San Jose, Calif.

Step 16 includes all of the design iteration of the process of the present invention and will be discussed in greater detail subsequently with reference to FIGS. 13 and 14. Preferably, the generation of the tiling script of step 16 takes place within the environment of a computerized spreadsheet program. In the preferred embodiment of the present invention the spreadsheet program Excel available from Microsoft Corporation of Seattle, Wash. is used. A preferred hardware platform for the Excel program is a Macintosh computer available from Apple Computers, Inc. of Cupertino, Calif. Versions of the software program embodied in step 16 have also been run on an IBM-PC compatible computer using the Lotus 1-2-3 spreadsheet program available from Lotus Development Corporation of Boston, Mass.

Step 16 produces both a tiling script and a complete netlist in response to the empty netlist produced by step 12. The netlist is input into step 20, which verifies that the circuit will perform as specified. A software package known as SPICE, which was first developed at the University of California at Berkeley, Berkeley, Calif., is typically used for the circuit simulation and verification of step 20. Commercially available versions of SPICE are sold by MicroSim of Irvine, Calif. under the trademark PSpice and by Meta Software of Los Gatos, Calif. under the trademark HSpice. Step 20 can be eliminated if independent circuit verification is not desired.

Finally, step 22 utilizes the tiling script developed by step 16 and the modules produced by step 18 to assemble individual device modules into the physical layout of an analog or analog/digital integrated circuit. Software to accomplish the tiling of step 22 is commercially available as the program SLICE from VLSI Technology, Inc. of San Jose, Calif. or the program TimLager from the University of California at Berkeley. The output of steep 22 is typically in Caltech Intermediate Format (CIF) as specified by the California Institute of Technology of Pasadena, Calif. and is used to produce the integrated circuit masks for the analog or analog/digital circuitry.

It should be noted that the line width and feature size of the analog circuitry produced can be scaled upwardly or downwardly by simply modifying the library of device modules of step 14 and updating the device module information within step 16. MOSIS provides lambda based scalable design rules for scalable CMOS (SCMOS) using 1-3 micron technologies. Copies of the scalable design rules are available from MOSIS, University of Southern California, Marina del Rey, Calif. While the use of scalable design rules such as those provided by MOSIS reduces device density, the ability to migrate circuit designs to different lambda technologies often outweigh this disadvantage. Nonetheless, the scalable designs of the device modules of the present invention approach the densities achievable by fully custom designed analog ASICs while retaining the ability to be scaled upwardly or downwardly in size.

Figure 3:
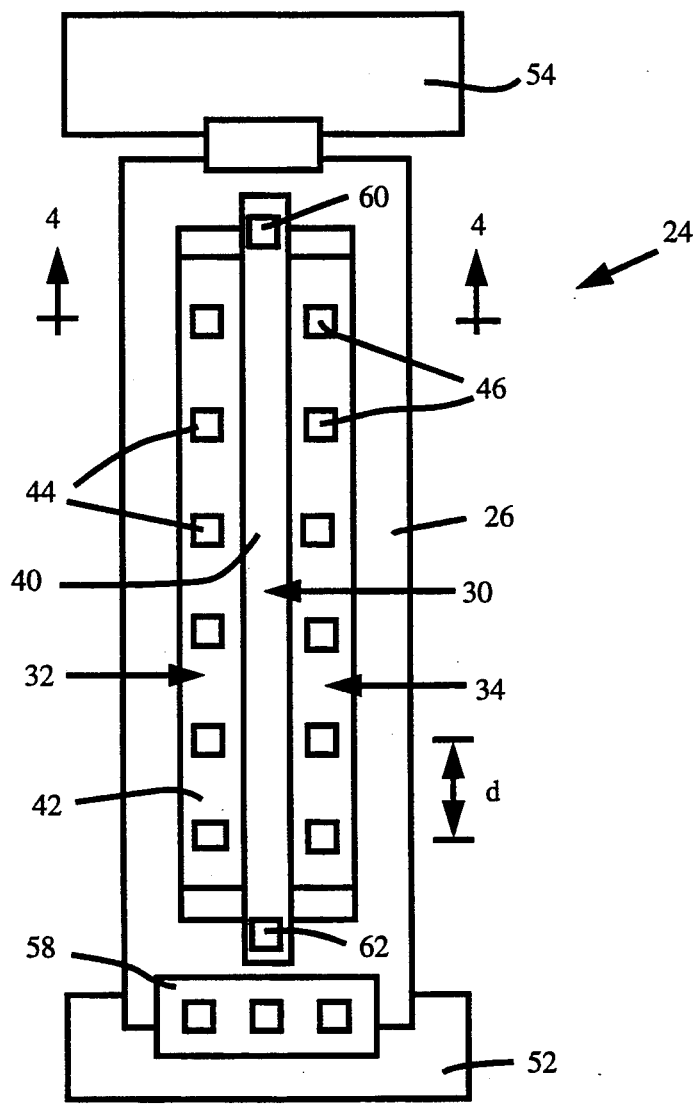
FIG. 3 is a top plan view of a basic device module in accordance with the present invention.
Figure 4:
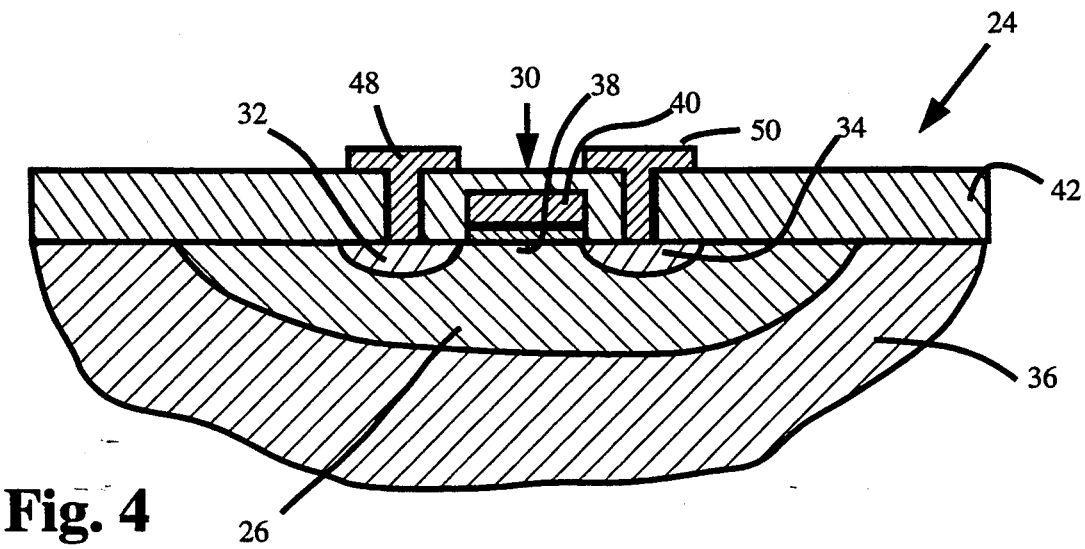
FIG. 4 is a cross-section taken along line 4—4 of FIG. 3.

Referring to FIG. 3, a basic device module 24 includes a well region 26, a gate region 30, a source region 32 and a drain region 34. With additional reference to FIG. 4, when the basic device module 24 is manufactured in a semiconductor substrate 36 the source region 32 and the drain region 34 comprise a semiconductor of a first conductivity type, while the channel region 38 and the well 26 comprise a semiconductor of a second conductivity type. A gate structure 40 is formed over the channel region 38 in the gate region 30. Overlying the gate structure 40, the source region 32 and the drain region 34 is a first insulating layer 42, which is preferably an oxide of the substrate material. The first insulating layer 42 in FIG. 3 is provided with a first plurality of vias 44 overlying the source region 32 and a second plurality of vias 46 overlying the drain region 34. The first plurality of vias 44 and the second plurality of vias 46 are evenly spaced by a distance d from each other and are symmetrically aligned around the gate structure 40. The distance d is made sufficiently large to permit conductive lines to run between the vias, as will be discussed in greater detail subsequently. A first first-level conductive line 48 in FIG. 4 is disposed over the first insulating layer 42 in alignment with the source region 32 such that it contacts the source region through the first plurality of vias 44. A second first-level conductive line 50 is disposed over the insulating layer 42 in alignment with the drain region 34 such that it contacts the drain region through the second plurality of vias 46.

The device module 24 in FIG. 3 also includes a ground bar 52 and a power bar 54 (FIG. 3). A guard ring 58 couples the ground bar 52 to the well 26 to prevent latch-up, a destructive phenomenon in CMOS IC devices. An alignment box is used to align multiple copies of the device module 24 into larger modules, as will be discussed subsequently. The gate structure 40 may be contacted at gate contact points 60 and/or 62. As will be discussed subsequently, the device module 24 is usually covered with a second insulating layer and with a plurality of second level conductive lines running perpendicularly to the first level conductive lines 48 and 50.

Figure 5:
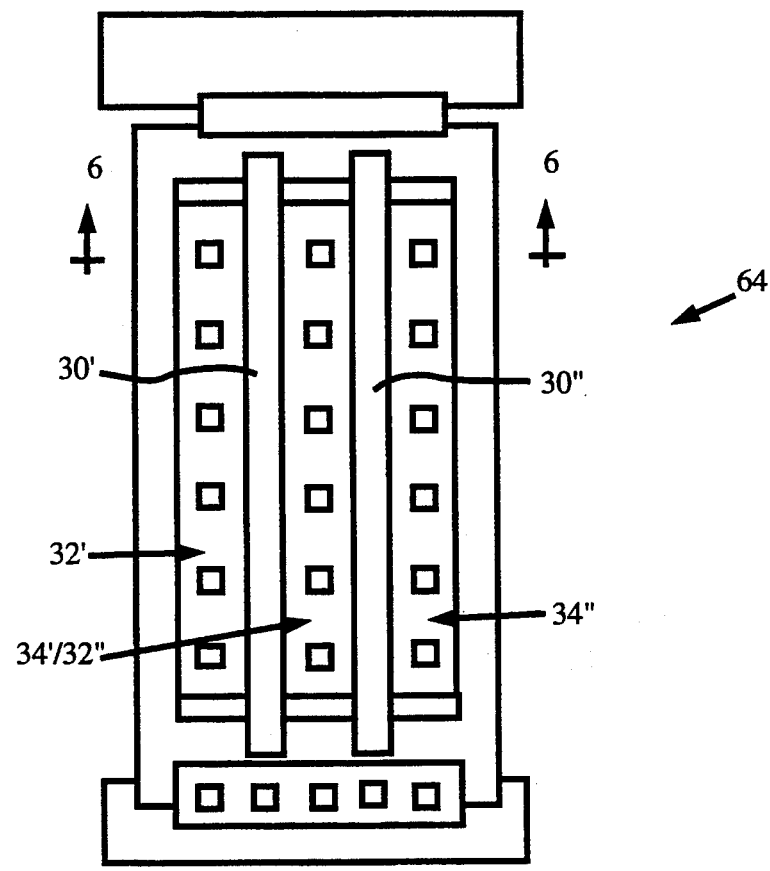
FIG. 5 is a top plan view of another device module in accordance with the present invention which is formed from two of the basic device modules of FIG. 3.

FIG. 5 illustrates a device module 64 which is constructed from two device modules 24 from FIG. 4. More specifically, and with additional reference to FIG. 6, a drain region 34' of a first device module 24' coincides with a source region 32" of a second device module 24". The remaining portions of device module 64, such as gate regions 30' and 30", source region 32' and drain region 34", are analogous to the corresponding portions of the two device modules from which it is constructed. The result of this construction is a device module 64 having greater current capacity than the basic device module 24 of FIG. 3 but which takes up only approximately 50% more surface area. By extending this basic idea, MOSFET transistors of virtually any size can be created, making for the rapid design of analog componentry.

Figure 6:
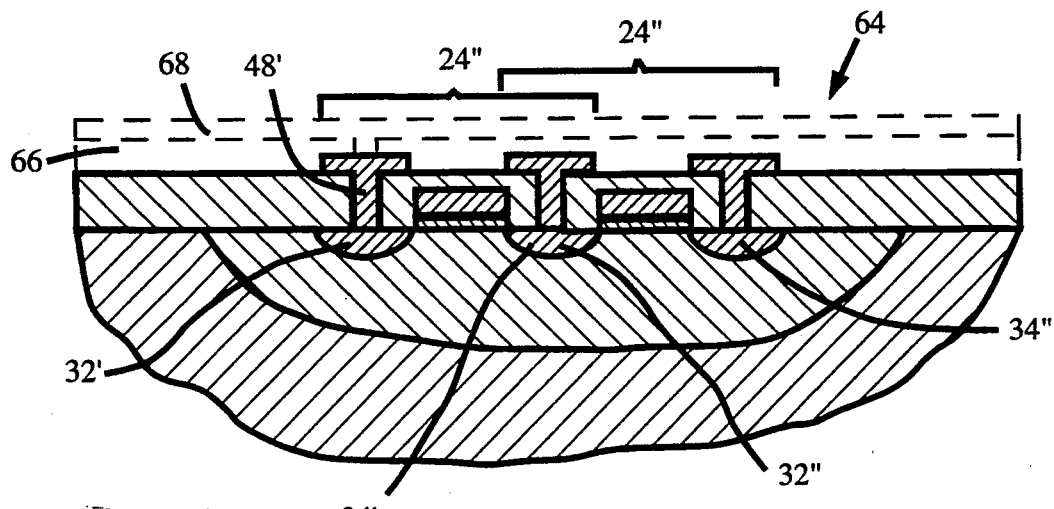
FIG. 6 is a cross-section taken along line 6—6 of FIG. 5.

FIG. 6 illustrates, in phantom, the use of a second insulating layer 66 and a second level conductive line 68. For the purpose of illustration, the second level conductive line 68 is shown to contact first first-level conductive line 48', i.e. it is electrically coupled to the source region 32'. The second level conductive line 68 will be discussed in greater detail with reference to FIG. 11.

FIGS. 7a-7e illustrate several ways that device modules can be combined together. In FIG. 7a two device modules 24' and 24" are overlapped as previously discussed with reference to FIGS. 5 and 6. In FIG. 7b, two device modules 24' and 24" are simply abutted to result in two side-by-side MOSFET transistors. In FIG. 7c, two device modules 24' and 24" are separated by a spacer 70, the purpose of which will be discussed with reference to FIG. 8. FIG. 7c also shows an end cap 72 overlapping with device module 24". The purpose of end cap 72 is to terminate a string of device modules, often at the edge of the integrated circuit, and typically comprises a guard ring which mates with the guard ring of the device modules. In other words, the end cap structure typically serves to complete the guard ring encircling the analog circuitry.

As illustrated in FIGS. 7d and 7e, the device modules can be combined longitudinally as well as laterally. In FIG. 7d, two device modules 24' and 24" are overlapped such that either their power or ground bars coincide. The modules 24' and 24" in FIG. 7d can be of opposite types, i.e. one can be an N-channel MOSFET while the other is a P-channel MOSFET, or they can be both of the same type but symmetrically inverted with respect to their overlapped portions. Finally, in FIG. 7e, two device modules 24' and 24" can be longitudinally abutted to provide two adjacent MOSFET transistor devices.

In FIG. 8, two device modules 64' and 64" are shown in a laterally disposed relationship. These two device modules are of the same type and, therefore, can share a common well 26 in the substrate 36. Rather than being directly abutted, the two device modules are separated by a spacer 70' which is of the same polarity type as the well 26 but which is at a higher dopant level. The spacer 70' is not always necessary, i.e. the two device modules may often be directly abutted, but it will reduce the chance of latchup at higher current densities and, therefore, is often a desirable addition to the circuit.

In FIG. 9, a pair of device modules 64' and 64" are laterally disposed but, since they are of different polarity types, the module each have their own wells 26' and 26", respectively. If wells of different polarity types directly abut, a diode forms between them. Normally, this diode is reverse biased became of the operating potential of the wells and, therefore, well abutment is not necessarily fatal to the operation of the circuit. However, to prevent such problems such as excessive leakage or possible reverse bias breakdown it is often desirable to physically separate wells of opposite polarities. In the example shown, the device modules 64' and 64" are sufficiently separated so that bulk material from the substrate 36 separates and electrically isolates them.

In FIG. 10, a device module 64 is shown with well region 26, the rows of source/drain vias such as the first plurality of vias 44, the guard ring 58 the gate regions 30' and 30". A first conductive strap or gate line 74 is shown to have a via extending through gate region 30' to contact a first gate structure and a second conductive gate line 76 is shown to have a via extending through gate region 30" to contact a second gate structure.

In FIG. 11, the device module 64 has the second insulating layer 66 applied over the device structure shown in FIG. 10 and a number of second-level conductive lines 68 applied over the second insulating layer 66. Vias 78 couple selected second-level conductive lines 68 to selected first-level conductive lines.

It should be noted that the second-level conductive lines 68 have a width w which is less than the distance d between adjacent vias through the first insulating layer. This permits the second-level conductive lines 68 to be muted over the device module 64 for greater circuit density while permitting vias to connect the second-level conductive lines 68 to planar portions of the first level conductive lines between their vias. As mentioned previously, digital design tools do not route second-level lines over their active structures because the structures are too small and often require too many interconnections. Therefore, the muting of the second-level conductive lines 68 over the device modules and between the first-level vias as taught by the present invention is particularly well adapted to the design of scalable, high density analog circuitry.

In FIG. 12 a number of device modules of various polarities, sizes, interconnections and current carrying capabilities are "tiled" together to form a portion of a circuit 80. This figure will be discussed later in greater detail in the context of a specific example.

Figure 13:
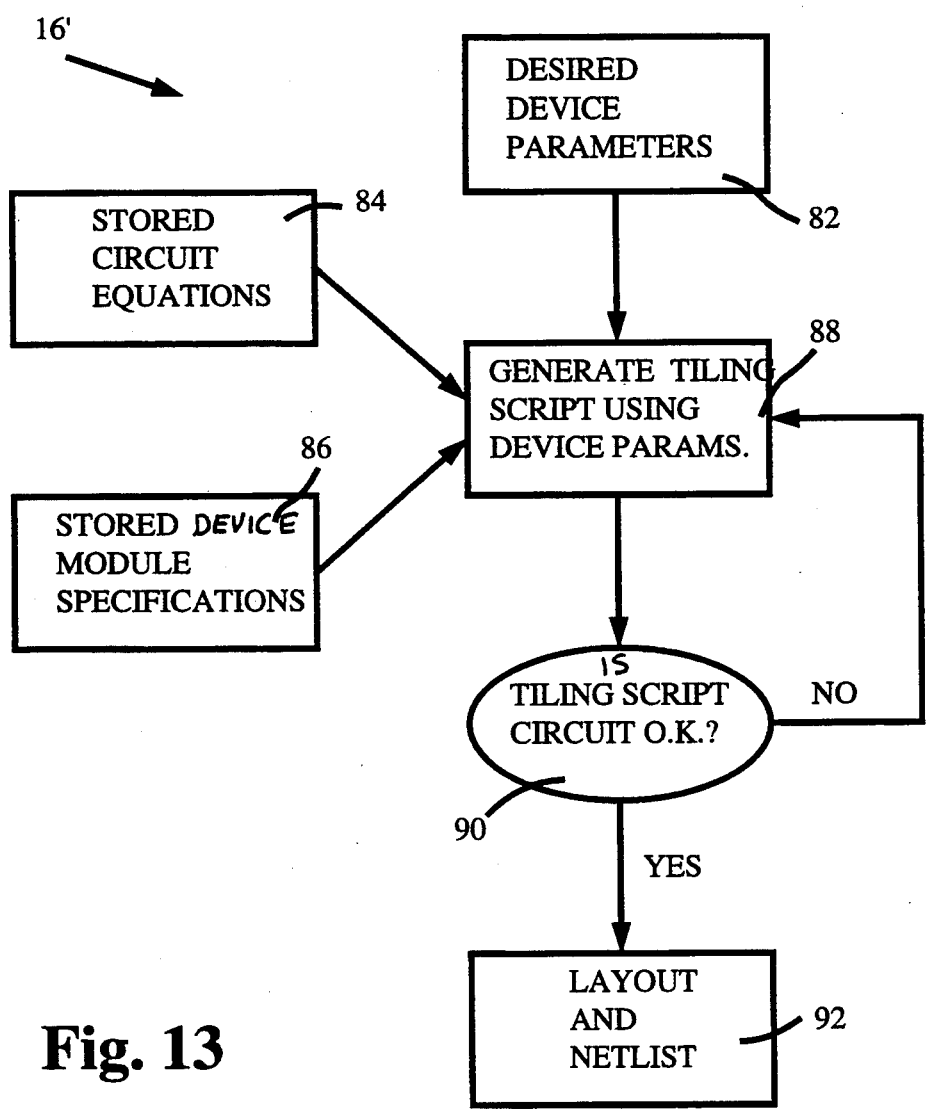
FIG. 13 is a flow diagram illustrating a first iterative process for generating a tiling script for the analog circuit design process of FIG. 2.

FIG. 13 is a flow diagram of a first iterative method 16' for generating the device specifications and tiling scripts of the functional step 16 of FIG. 2. As mentioned previously, the process within functional step 16 is preferably run in an interactive and recursive computerized spreadsheet program such as Microsoft's Excel. In a first step 82, a user inputs desired device parameters into the spreadsheet. The stored circuit equations of step 84 and the stored device module specifications of step 86 are already within the spreadsheet program. The stored circuit equations are specific to the type of circuit being designed and, therefore, a separate spreadsheet program is used for each circuit being designed. The actual circuit equations for the circuits are easily developed by those skilled in the art of analog IC design. For example, *CMOS Analog Circuit Design*, P. E. Allen and D. R. Holberg, Holt, Rinehard and Winston, N.Y., 1987, is a basic text which describes the development of circuit equations from circuit diagrams. The stored device module specifications can be empirically derived from the device modules or can be derived from IC device theory. Next, in a step 88, an initial tiling script is derived using the desired device parameters, the stored circuit equations, and the stored device module specifications. Then, in a decision step 90, the circuit described by the tiling script is analyzed to see if the operating characteristics of the circuit taken as a whole are acceptable. If they are, the tiling script (layout) and netlist are output in step 92. If they are not, step 88 is repeated with a modified tiling script until an acceptable circuit is derived.

The decision made at step 90 can be made by an analog circuit designer or it can be performed automatically by the spreadsheet program using predetermined criteria. It should be noted that all design iterations are accomplished within the process of method 16', i.e. costly and time consuming iterations do not have to be done in a number of programs as illustrated in FIG. 1.

Essentially, the spreadsheet program is performing a series of "what-if" scenarios to ultimately determine an acceptable tiling script.

Figure 14:
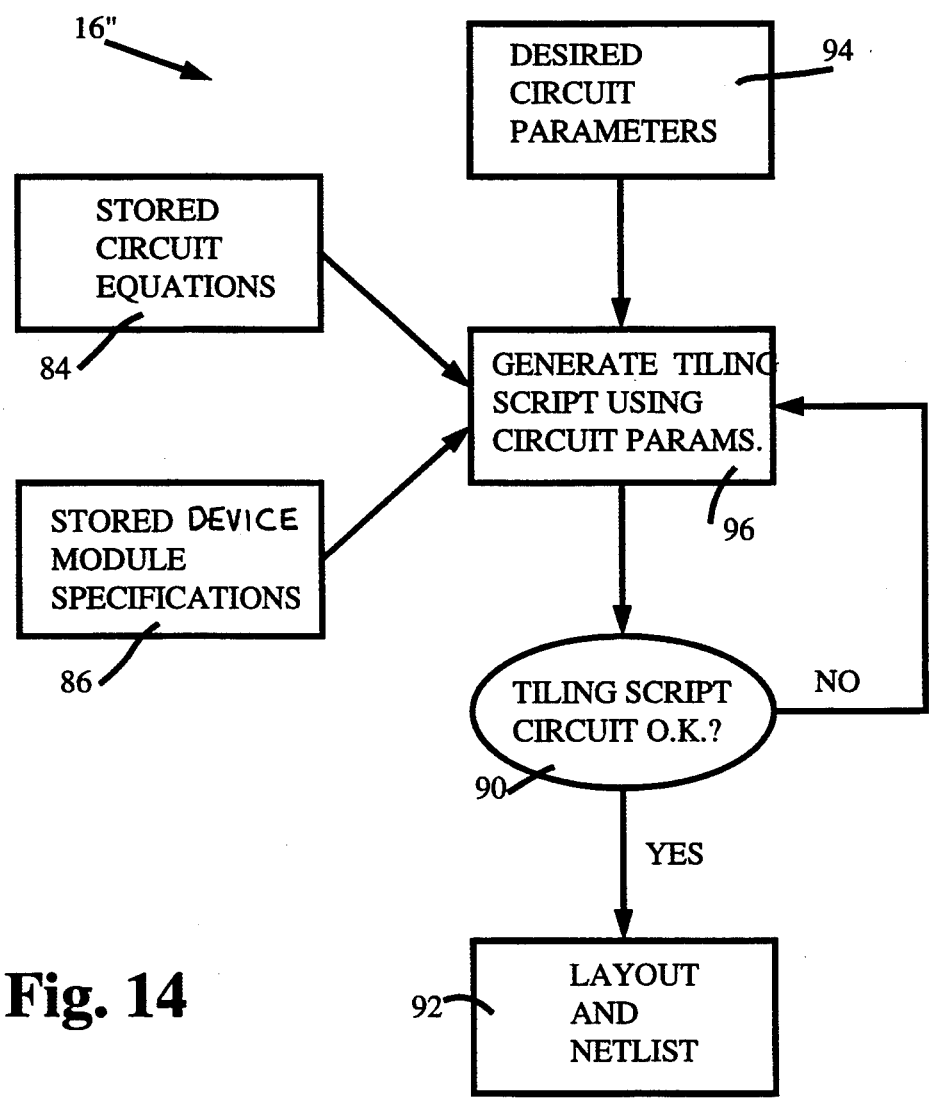
FIG. 14 is a flow diagram illustrating a second iterative process for generating a tiling script for the analog circuit design process of FIG. 2.

In FIG. 14 a flow diagram of another iterative method 16" for generating device specifications and tiling scripts is shown. In this method, steps 84, 86, 90 and 92 are the same as those steps described with reference to FIG. 13. However, in method 16", a step 94 calls for the input of the circuit parameters of the analog circuit and a step 96 generates tiling scripts and device parameters in an attempt to meet the specified circuit parameters. As before, the method 16" is either a manual or automatic iterative process where a circuit specified by the tiling script is analyzed to determine whether the desired circuit parameters have been met. If they have, step 92 outputs the tiling script (layout) and netlist. If the circuit parameters have not been met then steps 96 and 90 are iteratively repeated until a satisfactory solution has been generated.

Figure 15:
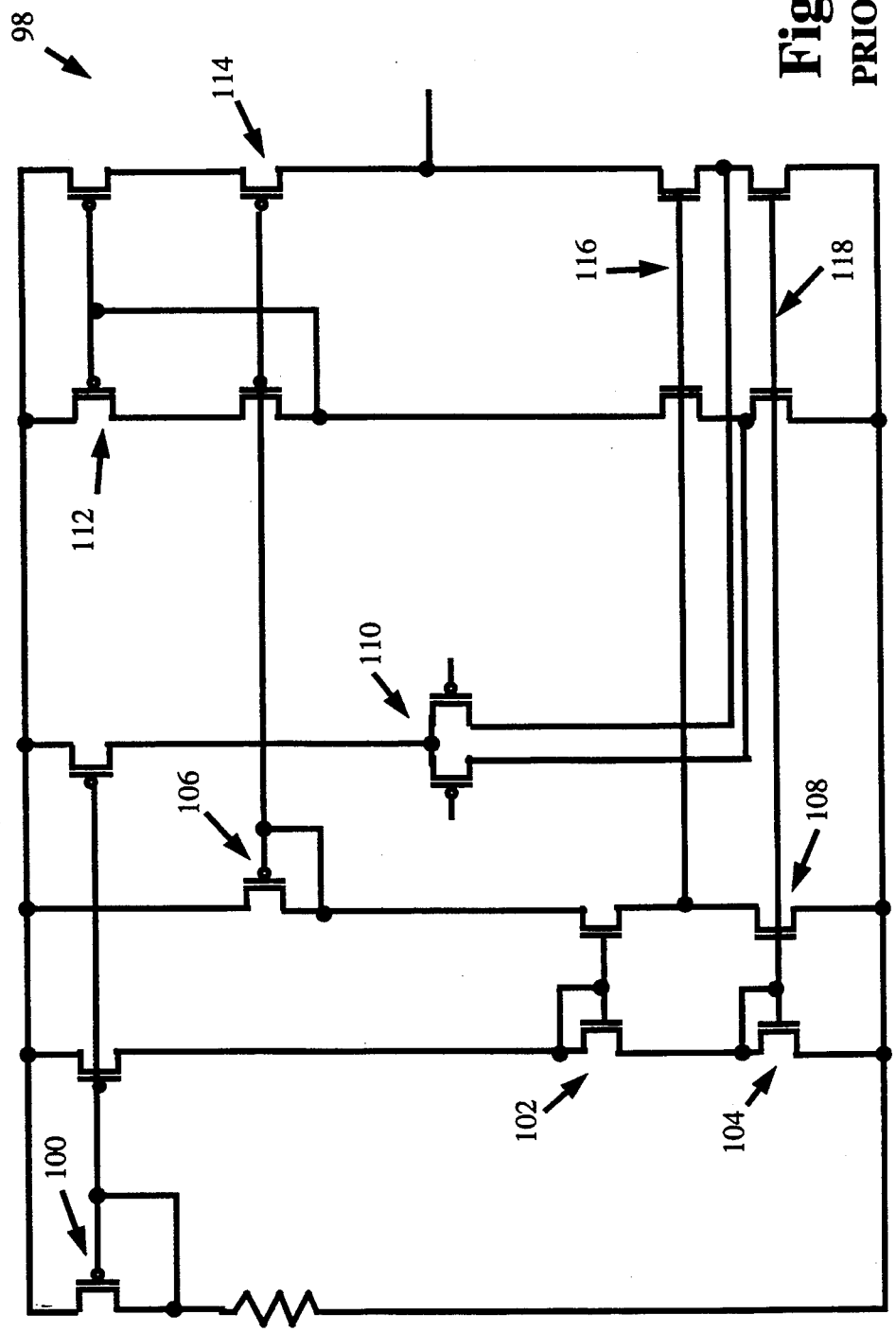
FIG. 15 is a schematic of a prior art operational amplifier which is used as an analog design example to illustrate the operation of the present invention.

The operation of the method 16' (FIG. 13) will be described in terms of a specific example. In FIG. 15, the circuit schematic of a typical, prior art CMOS folded cascode operational amplifier (op amp) 98 is shown. The op amp 98 includes a p bias mirror 100, an n bias cascode small 102, an n bias mirror 104, a p high swing bias 106, an n bias cascode large 108, an input differential pair 110, a load mirror 112, a load mirror cascode 114, an input mirror cascode 116, and an input mirror 118. This schematic is input into step 12 (FIG. 2) to produce the empty netlist for method 16'.

Figure 16:
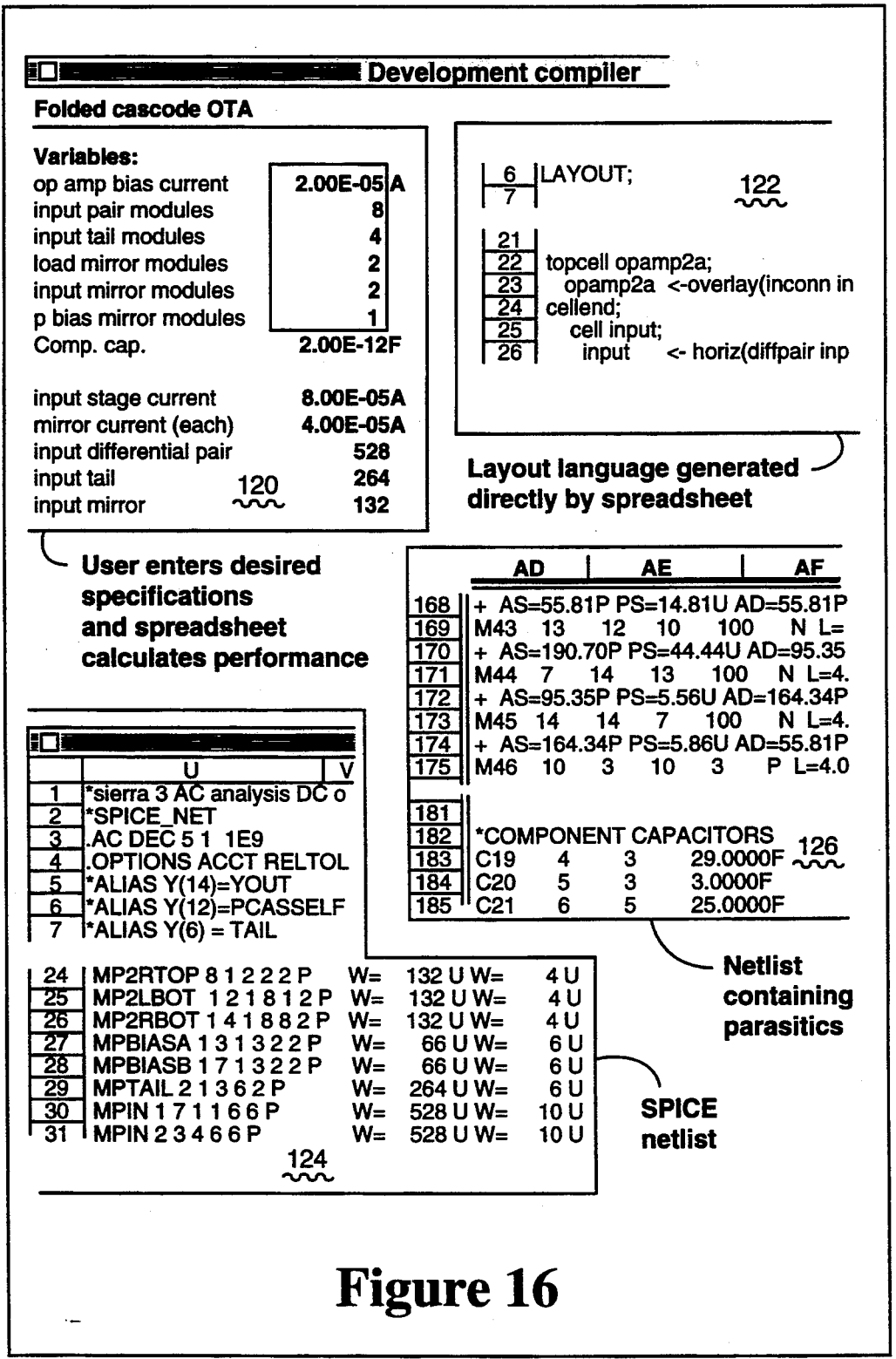
FIG. 16 illustrates portions of a Microsoft Excel spreadsheet display running the software process illustrated in FIG. 13 to produce a tiling script and net list for the operational amplifier illustrated in FIG. 15.

In FIG. 16, the display of an Excel spreadsheet asks for the desired device parameters in a window 120, corresponding to step 82 of FIG. 13. Window 122 illustrates the tiling script which can be generated directly by the spreadsheet program. Windows 124 and 126 illustrate that the SPICE netlist can be provided either with parasitics (i.e. unwanted capacitive and inductive characteristics of the circuit) or without the parasitics. A complete listing of the Microsoft Excel spreadsheet program which generated the display of FIG. 16 is attached hereto as Appendix A and forms a part of this specification.

FIG. 16 illustrates the important point that the parasitics of the designed circuit can be analyzed before the circuit is analyzed within a SPICE circuit simulator. In other words, another external iterative process required in the prior art has been eliminated in the present invention. Since the process 16 operates with device modules of known parasitic properties, the process 16 can directly calculate the parasitic behavior of any particular tiling script as a part of the design process.

Referring once again to FIG. 12, circuit portion 80 represents a portion of the op amp 98 as generated by the tiling program of the present invention. More specifically, portion 130 represents the input differential pair 110, portion 140 represents input mirror cascode 116, portion 142 represents input mirror 118, portion 144 represents load mirror cascode 114, portion 146 represent load mirror 112, portion 148 represents n bias mirror 104, portion 150 represents n bias cascode small 102 and n bias cascode large 108, portion 152 represents p bias mirror 100 and portion 154 represents p high swing bias 106. Various spacers are shown in heavy diagonal cross-hatching. The different shading of the modules correspond to p-channel and n-channel modules.

While this invention has been described in terms of several preferred embodiments, it is contemplated that alterations, modifications and permutations thereof will become apparent to those skilled in the art upon a reading of the specification and study of the drawings. It is therefore intended that the following appended claims include all such alterations, modifications and permutations as fall within the true spirit and scope of the present invention.

APPENDIX A

```
ID;PXL;N;E
P;PGeneral
P;P0
P;P0.00
P;P#,##0
P;P#,##0.00
P;P"$"#,##0\);\("$"#,##0\)
P;P"$"#,##0.00\);\("$"#,##0.00\)
P;P0%
P;P0.00%
P;P0.00E+00
P;Pm\/d\/yy
P;Pd\-mmm\-yy
P;Pd\-mmm
P;Pmmm\-yy
P;Ph\:mm\ AM/PM
P;Ph\:mm\:ss\ AM/PM
P;Ph\:mm
P;Ph\:mm\:ss
P;Pm\/d\/yy\h\:mm
P;P0.0E+00
P;P0.000
F;P0;DG0G10;G;H;N20 10
B;Y80;X18
O;L
F;W3 4 8
F;W7 8 8
NN;NAV_1;ER36C3
NN;NAV_2;ER37C3
NN;NC_C;ER19C3
NN;NC_L;ER20C3
NN;NFLAGN2;ER76C2
NN;NGAMMA_N;ER46C2
NN;NGM_2;ER34C3
NN;NGM_4;ER34C7
NN;NGM_6;ER35C3
NN;NG_DSN;ER57C2
NN;NG_DSN_L;ER65C2
NN;NG_DSN_S;ER70C2
NN;NG_MBSN_L;ER66C2
NN;NG_MBSN_S;ER71C2
NN;NG_MN;ER56C2
NN;NG_MN_L;ER64C2
NN;NG_MN_S;ER69C2
NN;NI_5;ER4C3
NN;NI_6;ER5C3
NN;NI_DSN_L;ER63C2
NN;NI_DSN_S;ER68C2
NN;NKP_2;ER24C3
NN;NKP_4;ER25C3
NN;NK_PN;ER45C2
NN;NLAMBDA_2;ER26C3
NN;NLAMBDA_4;ER27C3
NN;NLAMBDA_N;ER48C2
NN;NLIN_SAT_N;ER74C2
NN;NL_2;ER8C3
NN;NL_4;ER10C3
NN;NL_5;ER12C3
NN;NL_6;ER17C3
NN;NL_7;ER15C3
NN;NL_N;ER45C4
NN;NPOLY_POLY_SPACE;ER36C7
NN;NTWOPHIF_N;ER47C2
```

```
NN;NVT_2;ER28C3
NN;NVT_4;ER29C3
NN;NV_DD;ER30C3
NN;NV_DSN;ER47C4
NN;NV_GSN;ER46C4
NN;NV_GSN_V_T;ER73C2
NN;NV_SBN;ER48C4
NN;NV_SS;ER31C3
NN;NV_TN;ER54C2
NN;NV_TN0;ER44C2
NN;NW_2;ER7C3
NN;NW_4;ER9C3
NN;NW_5;ER11C3
NN;NW_6;ER16C3
NN;NW_7;ER14C3
NN;NW_N;ER44C4
F;P19;FE1L;SDB;Y1;X1
C;N;K"University of Hawaii Two-Stage CMOS Op-amp Design Module"
F;P19;FE1G;SB;X2
F;P19;FE1G;SB;X3
F;P19;FE1G;SB;X4
F;P19;FE1G;SB;X5
F;P19;FE1G;SB;X6
F;P19;FE1G;X7
F;P19;FE1G;X8
F;P19;FE1L;X9
C;K"TITLE:"
F;P19;FE1L;X10
C;N;K"SPICE GENERATION FOR ALLEN DESIGN (SIMPLIFIED FOR PSPICE DEMO)"
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y2;X1
F;P19;FE1L;X2
C;N
F;P19;FE1G;X3
F;P19;FE1G;X4
F;P19;FE1G;X5
F;P19;FE1G;X6
F;P19;FE1G;X7
F;P19;FE1G;X8
F;P19;FE1L;X9
C;K"*PSPICE DECK GENERATED BY OP-AMP DESIGN PROGRAM"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y3;X1
F;P19;FE1G;X2
F;P19;FE1L;SB;X3
C;K"design#1"
F;P19;FE1L;SB;X4
C;K"design#2"
F;P19;FE1G;X5
F;P19;FE1G;X6
F;P19;FE1L;SB;X7
C;K"design#1"
F;P19;FE1L;SB;X8
C;K"design#2"
```

```
F;P19;FE1L;X9
C;K"*.SUBCKT TWOSTAGE1 1 2 6 8 9"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y4;X1
C;K"Tail current I_5"
F;P19;FE1G;X2
F;P19;FE1G;X3
C;K0.0000088
F;P19;FE1G;X4
C;K0.0000088
F;P19;FE1L;X5
C;K"Slew rate V/uS"
F;P19;FE1G;X6
F;P19;FE1G;X7
C;K2;EI_5/(C_C*1000000)
F;P19;FE1G;X8
C;K2;ERC[-4]/(R[+15]C[-4]*1000000)
F;P19;FE1L;X9
C;K"M1 4 2 3 3"
F;P19;FE1G;X10
F;P19;FE1G;X11
F;P19;FE1L;X12
C;K"NMOS1"
F;P19;FE1L;X13
C;K"W="
F;P9;FE2G;X14
C;K0.000043;E0.000001*W_2
F;P19;FE1G;X15
F;P19;FE1L;X16
C;K"L="
F;P9;FE2G;X17
C;K0.00001;E0.000001*L_2
F;P19;FE1G;X18
F;P19;FE1L;Y5;X1
C;K"2nd stage I_6"
F;P19;FE1G;X2
F;P19;FE1G;X3
C;K0.000152
F;P19;FE1G;X4
C;K0.000152
F;P19;FE1L;X5
C;K"Mirror burden/V"
F;P19;FE1G;X6
F;P2;FF2G;X7
C;K1.0488088481702;ESQRT(I_5/(KP_4*W_4/L_4))+ABS(VT_4)-ABS(VT_2)
F;P2;FF2G;X8
C;K1.0488088481702;ESQRT(R[-1]C[-4]/(R[+20]C[-4]*R[+4]C[-4]/R[+5]C[-4]))+ABS(R[+24]C[-4])-
ABS(R[+23]C[-4])
F;P19;FE1L;X9
C;K"M2 5 1 3 3"
F;P19;FE1G;X10
F;P19;FE1G;X11
F;P19;FE1L;X12
C;K"NMOS1"
F;P19;FE1L;X13
C;K"W="
F;P9;FE2G;X14
C;K0.000043;E0.000001*W_2
F;P19;FE1G;X15
F;P19;FE1L;X16
C;K"L="
F;P9;FE2G;X17
```

```
C;K0.00001;E0.000001*L_2
F;P19;FE1G;X18
F;P19;FE1G;Y6;X1
F;P19;FE1G;X2
F;P19;FE1G;X3
F;P19;FE1G;X4
F;P19;FE1L;X5
C;K"Tail burden/V"
F;P19;FE1G;X6
F;P2;FF2G;X7
C;K1.8689260154805;ESQRT(I_5/(KP_2*W_2/L_2))+ABS(VT_2)+SQRT(2*I_5/(KP_2*W_5/L_5))
F;P2;FF2G;X8
C;K1.8689260154805;ESQRT(R[-2]C[-4]/(R[+18]C[-4]*R[+1]C[-4]/R[+2]C[-4]))+ABS(R[+22]C[-4])+SQRT(2*R[-2]C[-4]/(R[+18]C[-4]*R[+5]C[-4]/R[+6]C[-4]))
F;P19;FE1L;X9
C;K"M3 4 4 8 8"
F;P19;FE1G;X10
F;P19;FE1G;X11
F;P19;FE1L;X12
C;K"PMOS1"
F;P19;FE1L;X13
C;K"W="
F;P9;FE2G;X14
C;K0.00001;E0.000001*W_4
F;P19;FE1G;X15
F;P19;FE1L;X16
C;K"L="
F;P9;FE2G;X17
C;K0.00001;E0.000001*L_4
F;P19;FE1G;X18
F;P19;FE1L;Y7;X1
C;K"Input device W_2"
F;P19;FE1G;X2
C;X3;K43
C;X4;K43
F;P19;FE1L;X5
C;K"Gain AV=AV_1*AV_2"
F;P19;FE1G;X6
F;P19;FE1G;X7
C;K12187.714080388;EAV_1*AV_2
F;P19;FE1G;X8
C;K12187.714080388;ER[+29]C[-4]*R[+30]C[-4]
F;P19;FE1L;X9
C;K"M4 5 4 8 8"
F;P19;FE1G;X10
F;P19;FE1G;X11
F;P19;FE1L;X12
C;K"PMOS1"
F;P19;FE1L;X13
C;K"W="
F;P9;FE2G;X14
C;K0.00001;E0.000001*W_4
F;P19;FE1G;X15
F;P19;FE1L;X16
C;K"L="
F;P9;FE2G;X17
C;K0.00001;E0.000001*L_4
F;P19;FE1G;X18
F;P19;FE1L;Y8;X1
C;K"Input device L_2"
F;P19;FE1G;X2
C;X3;K10
C;X4;K10
F;P19;FE1L;X5
C;K"GBW (rads)"
F;P19;FE1G;X6
F;P19;FE1G;X7
C;K5764310.2559866;EGM_2/C_C
F;P19;FE1G;X8
C;K5764310.2559866;ER[+26]C[-4]/R[+11]C[-4]
```

```
F;P19;FE1L;X9
C;K"M5 3 7 9 9"
F;P19;FE1G;X10
F;P19;FE1G;X11
F;P19;FE1L;X12
C;K"NMOS1"
F;P19;FE1L;X13
C;K"W="
F;P9;FE2G;X14
C;K0.000038;E0.000001*W_5
F;P19;FE1G;X15
F;P19;FE1L;X16
C;K"L="
F;P9;FE2G;X17
C;K0.00001;E0.000001*L_5
F;P19;FE1G;X18
F;P19;FE1L;Y9;X1
C;K"Mirror W_4"
F;P19;FE1G;X2
C;X3;K10
C;X4;K10
F;P19;FE1L;X5
C;K"Output pole P_2"
F;P19;FE1G;X6
F;P19;FE1G;X7
C;K-14462088.36925;E-GM_6/C_L
F;P19;FE1G;X8
C;K-14462088.36925;E-R[+26]C[-4]/R[+11]C[-4]
F;P19;FE1L;X9
C;K"M6 6 5 8 8"
F;P19;FE1G;X10
F;P19;FE1G;X11
F;P19;FE1L;X12
C;K"PMOS1"
F;P19;FE1L;X13
C;K"W="
F;P9;FE2G;X14
C;K0.000344;E0.000001*W_6
F;P19;FE1G;X15
F;P19;FE1L;X16
C;K"L="
F;P9;FE2G;X17
C;K0.00001;E0.000001*L_6
F;P19;FE1G;X18
F;P19;FE1L;Y10;X1
C;K"Mirror L_4"
F;P19;FE1G;X2
C;X3;K10
C;X4;K10
F;P19;FE1L;X5
C;K"RHP zero Z_1"
F;P19;FE1G;X6
F;P19;FE1G;X7
C;K65736765.314773;EGM_6/C_C
F;P19;FE1G;X8
C;K65736765.314773;ER[+25]C[-4]/R[+9]C[-4]
F;P19;FE1L;X9
C;K"M7 6 7 9 9"
F;P19;FE1G;X10
F;P19;FE1G;X11
F;P19;FE1L;X12
C;K"NMOS1"
F;P19;FE1L;X13
C;K"W="
F;P9;FE2G;X14
C;K0.000653;E0.000001*W_7
F;P19;FE1G;X15
F;P19;FE1L;X16
C;K"L="
F;P9;FE2G;X17
```

```
C;K0.00001;E0.000001*L_7
F;P19;FE1G;X18
F;P19;FE1L;Y11;X1
C;K"Tail device W_5"
F;P19;FE1G;X2
C;X3;K38
C;X4;K38
F;P19;FE1L;X5
C;K"Power P_D"
F;P19;FE1G;X6
F;P19;FE1G;X7
C;K0.001608;E(I_5+I_6)*(V_DD+ABS(V_SS))
F;P19;FE1G;X8
C;K0.001608;E(R[-7]C[-4]+R[-6]C[-4])*(R[+19]C[-4]+ABS(R[+20]C[-4]))
F;P19;FE1L;X9
C;K"*M8 7 7 9 9"
F;P19;FE1G;X10
F;P19;FE1G;X11
F;P19;FE1L;X12
C;K"PMOS1"
F;P19;FE1L;X13
C;K"W="
F;P9;FE2G;X14
C;K0.000038;E0.000001*W_5
F;P19;FE1G;X15
F;P19;FE1L;X16
C;K"L="
F;P9;FE2G;X17
C;K0.00001;E0.000001*L_5
F;P19;FE1G;X18
F;P19;FE1L;Y12;X1
C;K"Tail device L_5"
F;P19;FE1G;X2
C;X3;K10
C;X4;K10
F;P19;FE1L;X5
C;K"Device Area/um**2"
F;P19;FE1G;X6
F;P19;FE1G;X7
C;K11410;E2*W_2*L_2+2*W_4*L_4+W_6*L_6+W_7*L_7+W_5*L_5
F;P19;FE1G;X8
C;K11410;E2*R[-5]C[-4]*R[-4]C[-4]+2*R[-3]C[-4]*R[-2]C[-4]+R[+4]C[-4]*R[+5]C[-4]+R[+2]C[-4]*R[+3]C[-4]+R[-1]C[-4]*RC[-4]
F;P19;FE1L;X9
C;K"VBIAS 7 9 "
F;P19;FE1G;X10
F;P20;FF3G;X11
C;N;K1.512
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y13;X1
F;P19;FE1G;X2
F;P19;FE1G;X3
F;P19;FE1G;X4
F;P19;FE1L;X5
C;K"2*S7*S4/(S5*S6)"
F;P19;FE1G;X6
F;P19;FE1G;X7
C;K0.99908200734394;E2*(W_7/L_7)*(W_4/L_4)/((W_5/L_5)*(W_6/L_6))
F;P19;FE1G;X8
C;K0.99908200734394;E2*(R[+1]C[-4]/R[+2]C[-4])*(R[-4]C[-4]/R[-3]C[-4])/((R[-2]C[-4]/R[-1]C[-4])*(R[+3]C[-4]/R[+4]C[-4]))
F;P19;FE1L;X9
C;K"CC 5 6"
F;P19;FE1G;X10
```

```
F;P19;FE1G;X11
C;K0.00000000000044;ER[+6]C[-7]
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y14;X1
C;K"Driver load W_7"
F;P19;FE1G;X2
C;X3;N;K653
C;X4;N;K653
F;P19;FE1L;X5
C;K"I_5*S7/(I_6*S5)"
F;P19;FE1G;X6
F;P19;FE1G;X7
C;K0.99487534626039;EI_5*(W_7/L_7)/(I_6*(W_5/L_5))
F;P19;FE1G;X8
C;K0.99487534626039;ER[-10]C[-4]*(RC[-4]/R[+1]C[-4])/(R[-9]C[-4]*(R[-?]C[-4]/R[-2]C[-4]))
F;P19;FE1L;X9
C;K"*IBIAS 8 7"
F;P19;FE1G;X10
F;P19;FE1G;X11
C;K0.0000088;ER[-10]C[-7]
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y15;X1
C;K"Driver load L_7"
F;P19;FE1G;X2
C;X3;N;K10
C;X4;N;K10
F;P19;FE1L;X5
C;K"GM_4/GM_2"
F;P19;FE1G;X6
F;P19;FE1G;X7
C;K0.33081584678942;EGM_4/GM_2
F;P19;FE1G;X8
C;K0.33081584678942;ER[+19]C/R[+19]C[-4]
F;P19;FE1L;X9
C;K"*"
F;P19;FE1L;X10
C;K" "
F;P19;FE1L;X11
C;K" "
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y16;X1
C;K"Driver W_6"
F;P19;FE1G;X2
C;X3;N;K344
C;X4;N;K344
F;P19;FE1L;X5
C;K"VDS(SAT)_6"
F;P19;FE1G;X6
F;P19;FE1G;X7
C;K1.0510238640443;ESQRT(2*I_6/(KP_4*(W_6/L_6)))
```

```
F;P19;FE1G;X8
C;K1.0510238640443;ESQRT(2*R[-11]C[-4]/(R[+9]C[-4]*(RC[-4]/R[+1]C[-4])))
F;P19;FE1L;X9
C;K".ENDS"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y17;X1
C;K"Driver L_6"
F;P19;FE1G;X2
C;X3;N;K10
C;X4;N;K10
F;P19;FE1L;X5
C;K"VDS(SAT)_7"
F;P19;FE1G;X6
F;P19;FE1G;X7
C;K0.52330603166266;ESQRT(2*I_6/(KP_2*(W_7/L_7)))
F;P19;FE1G;X8
C;K0.52330603166266;ESQRT(2*R[-12]C[-4]/(R[+7]C[-4]*(R[-3]C[-4]/R[-2]C[-4])))
F;P19;FE1L;X9
C;K"*"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y18;X1
F;P19;FE1G;X2
F;P19;FE1G;X3
F;P19;FE1G;X4
F;P19;FE1L;X9
C;K"*"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y19;X1
C;K"Comp. Cap. C_C"
F;P19;FE1G;X2
F;P19;FE1G;X3
C;N;K0.0000000000044
F;P19;FE1G;X4
C;N;K0.0000000000044
F;P19;FE1L;X6
C;K">Page right for PSPICE"
F;P19;FE1G;X7
F;P19;FE1G;X8
F;P19;FE1L;X9
C;K"*"
F;P19;FE1G;X10
F;P19;FE1G;X11
F;P19;FE1G;X12
F;P19;FE1G;X13
F;P19;FE1G;X14
```

```
F;P19;FE1G;X15
F;P19;FE1G;X16
F;P19;FE1G;X17
F;P19;FE1G;X18
F;P19;FE1L;Y20;X1
C;K"Load Cap. C_L"
F;P19;FE1G;X2
F;P19;FE1G;X3
C;N;K0.00000000002
F;P19;FE1G;X4
C;N;K0.00000000002
F;P19;FE1L;X6
C;K">Page down to fill in constants"
F;P19;FE1G;X7
F;P19;FE1G;X8
F;P19;FE1L;X9
C;K"*MODELS BELOW"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y21;X1
C;K"Two stage op-amp designer - constants:"
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1L;X9
C;K"*NMOS MODEL"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y22;X1
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1L;X9
C;K".MODEL"
F;P19;FE1L;X10
C;K"NMOS1"
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y23;X1
F;P19;FE1G;X2
F;P19;FE1L;SB;X3
```

```
C;K"design#1"
F;P19;FE1L;SB;X4
C;K"design#2"
F;P19;FE1G;X5
F;P19;FE1G;X6
F;P19;FE1L;SB;X7
C;K"design#1"
F;P19;FE1L;SB;X8
C;K"design#2"
F;P19;FE1L;X9
C;K"+NMOS"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y24;X1
C;K"Input KP_2=uCox"
F;P19;FE1G;X2
F;P19;FE1G;X3
C;N;K0.000017
F;P19;FE1G;X4
C;N;K0.000017
F;P19;FE1L;X9
C;K"+VTO="
F;P19;FE1G;X10
C;N;K1
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y25;X1
C;K"Mirror KP_4=uCox"
F;P19;FE1G;X2
F;P19;FE1G;X3
C;N;K0.000008
F;P19;FE1G;X4
C;N;K0.000008
F;P19;FE1L;X9
C;K"+KP="
F;P19;FE1G;X10
C;N;K0.000017
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y26;X1
C;K"Input LAMBDA_2"
F;P19;FE1G;X2
C;X3;N;K0.01
C;X4;N;K0.01
F;P19;FE1L;X9
C;K"+GAMMA="
F;P19;FE1G;X10
C;N;K1.3
F;P19;FE1G;X11
```

```
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y27;X1
C;K"Mirror LAMBDA_4"
F;P19;FE1G;X2
C;X3;N;K0.02
C;X4;N;K0.02
F;P19;FE1L;X9
C;K"+LAMBDA="
F;P19;FE1G;X10
C;N;K0.01
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y28;X1
C;K"Input VT_2"
F;P19;FE1G;X2
C;X3;N;K1
C;X4;N;K1
F;P19;FE1L;X9
C;K"*+PHI="
F;P19;FE1G;X10
C;N;K0.7
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y29;X1
C;K"Mirror VT_4"
F;P19;FE1G;X2
C;X3;N;K-1
C;X4;N;K-1
F;P19;FE1G;X5
F;P19;FE1G;X6
F;P19;FE1G;X7
F;P19;FE1G;X8
F;P19;FE1L;X9
C;K"*+PB="
F;P19;FE1G;X10
C;N;K0.8
F;P19;FE1G;X11
C;N
F;P19;FE1G;X12
C;N
F;P19;FE1G;X13
C;N
F;P19;FE1G;X14
C;N
F;P19;FE1G;X15
C;N
F;P19;FE1G;X16
C;N
F;P19;FE1G;X17
C;N
F;P19;FE1G;X18
```

```
C;N
F;P19;FE1L;Y30;X1
C;K"V_DD"
F;P19;FE1G;X2
C;X3;N;K5
C;X4;N;K5
F;P19;FE1G;X5
F;P19;FE1G;X6
F;P19;FE1G;X7
F;P19;FE1G;X8
F;P19;FE1L;X9
C;K"*+MJ="
F;P19;FE1G;X10
C;N;K0.5
F;P19;FE1G;X11
C;N
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y31;X1
C;K"V_SS"
F;P19;FE1G;X2
C;X3;N;K-5
C;X4;N;K-5
F;P19;FE1G;X5
F;P19;FE1G;X6
F;P19;FE1G;X7
F;P19;FE1G;X8
F;P19;FE1L;X9
C;K"*+MJSW="
F;P19;FE1G;X10
C;N;K0.3
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y32;X1
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1L;X9
C;K"*+CGBO="
F;P19;FE1G;X10
C;N;K0.0000000002
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y33;X1
F;P19;FE1G;X2
F;P19;FE1G;X3
F;P19;FE1G;X4
F;P19;FE1G;X5
F;P19;FE1G;X6
```

```
F;P19;FE1G;X7
F;P19;FE1G;X8
F;P19;FE1L;X9
C;K"*+CGSO="
F;P19;FE1G;X10
C;N;K0.00000000035
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y34;X1
C;K"1st stage GM_2"
F;P19;FE1G;X2
F;P19;FE1G;X3
C;K0.000025362965126341;ESQRT(2*(W_2/L_2)*KP_2*I_5/2)
F;P19;FE1G;X4
C;K0.0000253629651263411;ESQRT(2*(R[-27]C/R[-26]C)*R[-10]C*R[-30]C/2)
F;P19;FE1L;X5
C;K"Mirror GM_4"
F;P19;FE1G;X6
F;P19;FE1G;X7
C;K0.0000083904707853612;ESQRT(2*(W_4/L_4)*KP_4*I_5/2)
F;P19;FE1G;X8
C;K0.0000083904707853612;ESQRT(2*(R[-25]C[-4]/R[-24]C[-4])*R[-9]C[-4]*R[-30]C[-4]/2)
F;P19;FE1L;X9
C;K"*+CGDO="
F;P19;FE1G;X10
C;N;K0.00000000035
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y35;X1
C;K"2nd stage GM_6"
F;P19;FE1G;X2
F;P19;FE1G;X3
C;K0.000289241767385;ESQRT(2*(W_6/L_6)*KP_4*I_6)
F;P19;FE1G;X4
C;K0.000289241767385;ESQRT(2*(R[-19]C/R[-18]C)*R[-10]C*R[-30]C)
F;P19;FE1L;X5
C;K"RO=RO6//RO7"
F;P19;FE1G;X6
F;P19;FE1G;X7
C;K219298.24561404;E1/(I_6*((10*LAMBDA_4/L_6)+(10*LAMBDA_2/L_7)))
F;P19;FE1G;X8
C;K219298.24561404;E1/(R[-30]C[-4]*((10*R[-8]C[-4]/R[-18]C[-4])+(10*R[-9]C[-4]/R[-20]C[-4])))
F;P19;FE1L;X9
C;K"*+CJ="
F;P19;FE1G;X10
C;N;K0.0003
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y36;X1
C;K"1 stage gain AV_1"
F;P19;FE1G;X2
F;P19;FE1G;X3
```

```
C;K192.14367519955;E2*GM_2/(I_5*((10*LAMBDA_2/L_2)+(10*LAMBDA_4/L_4)))
F;P19;FE1G;X4
C;K192.14367519955;E2*R[-2]C/(R[-32]C*((10*R[-10]C/R[-28]C)+(10*R[-9]C/R[-26]C)))
F;P19;FE1L;X5
C;K"Poly-poly_space/um"
F;P19;FE1G;X6
F;P19;FE1G;X7
C;K0.11
F;P19;FE1G;X8
C;K0.11
F;P19;FE1L;X9
C;K"*+CJSW="
F;P19;FE1G;X10
C;N;K0.0000000005
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y37;X1
C;K"2 stage gain AV_2"
F;P19;FE1G;X2
F;P19;FE1G;X3
C;K63.430212145834;EGM_6/(I_6*((10*LAMBDA_4/L_6)+(10*LAMBDA_2/L_7)))
F;P19;FE1G;X4
C;K63.430212145834;ER[-2]C/(R[-32]C*((10*R[-10]C/R[-20]C)+(10*R[-11]C/R[-22]C)))
F;P19;FE1L;X5
C;K"C_C_area/um**2"
F;P19;FE1G;X6
F;P19;FE1G;X7
C;K14028.985507246;EC_C*POLY_POLY_SPACE/0.0000000000000000345
F;P19;FE1G;X8
C;K14028.985507246;ER[-18]C[-4]*R[-1]C/0.0000000000000000345
F;P19;FE1L;X9
C;K"*+LD="
F;P19;FE1G;X10
C;N;K0.0000008
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y38;X1
C;K"Nulling R_N=1/GM_6"
F;P19;FE1G;X2
F;P19;FE1G;X3
C;K3457.3153422511;E1/GM_6
F;P19;FE1G;X4
C;K3457.3153422511;E1/R[-3]C
F;P19;FE1G;X5
F;P19;FE1G;X6
F;P19;FE1G;X7
F;P19;FE1G;X8
F;P19;FE1L;X9
C;K"*+TOX="
F;P19;FE1G;X10
C;N;K0.00000008
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
```

```
F;P19;FE1G;X18
F;P19;FE1G;Y39;X1
F;P19;FE1G;X2
F;P19;FE1G;X3
F;P19;FE1G;X4
F;P19;FE1L;X5
C;K">Page right for PSPICE MODELS"
F;P19;FE1G;X6
F;P19;FE1G;X7
F;P19;FE1G;X8
F;P19;FE1L;X9
C;K"*"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y40;X1
C;K">Page up for main menu"
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;K"*PMOS MODEL BELOW"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y41;X1
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1L;X9
C;K"*PMOS MODEL"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y42;X1
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1L;X9
C;K".MODEL"
```

```
F;P19;FE1L;X10
C;K"PMOS1"
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y43;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;K"+PMOS"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P0;FG0L;Y44;X1
C;X2;N
F;P0;FG0L;X3
C;X4;N
F;P0;FG0L;X5
C;X6;N
F;P0;FG0L;X7
C;X8;N
F;P19;FE1L;X9
C;K"+VTO="
F;P19;FE1G;X10
C;N;K-1
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y45;X1
F;P19;FE1G;X2
C;N
F;P19;FE1L;X3
C;X4;N
F;P19;FE1L;X5
F;P19;FE1G;X6
C;N
F;P19;FE1L;X7
C;X8;N
F;P19;FE1L;X9
C;K"+KP="
F;P19;FE1G;X10
C;N;K0.000008
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
```

```
F;P19;FE1G;X18
F;P19;FE1L;Y46;X1
C;X2;N
F;P19;FE1L;X3
C;X4;N
F;P19;FE1L;X5
C;X6;N
F;P0;FG0L;X7
C;X8;N
F;P19;FE1L;X9
C;K"+GAMMA="
F;P19;FE1G;X10
C;N;K0.6
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y47;X1
C;X2;N
F;P19;FE1L;X3
C;X4;N
F;P19;FE1L;X5
C;X6;N
F;P0;FG0L;X7
C;X8;N
F;P19;FE1L;X9
C;K"+LAMBDA="
F;P19;FE1G;X10
C;N;K0.02
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y48;X1
C;X2;N
F;P19;FE1L;X3
C;X4;N
F;P19;FE1L;X5
C;X6;N
F;P0;FG0L;X7
C;X8;N
F;P19;FE1L;X9
C;K"*+PHI="
F;P19;FE1G;X10
C;N;K0.6
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y49;X1
F;P19;FE1L;X2
F;P19;FE1G;X3
F;P19;FE1G;X4
F;P19;FE1L;X5
F;P19;FE1L;X6
F;P19;FE1L;X7
F;P19;FE1L;X8
C;K" "
```

```
F;P19;FE1L;X9
C;K"*+PB="
F;P19;FE1G;X10
C;N;K0.5
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y50;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;K"*+MJ="
F;P19;FE1G;X10
C;N;K0.5
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y51;X1
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1L;X9
C;K"*+MJSW="
F;P19;FE1G;X10
C;N;K0.25
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y52;X1
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1L;X9
C;K"*+CGBO="
F;P19;FE1G;X10
C;N;K0.0000000002
F;P19;FE1G;X11
F;P19;FE1G;X12
F;P19;FE1G;X13
F;P19;FE1G;X14
F;P19;FE1G;X15
F;P19;FE1G;X16
```

```
F;P19;FE1G;X17
F;P19;FE1G;X18
F;P19;FE1G;Y53;X1
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1L;X9
C;K"*+CGSO="
F;P19;FE1G;X10
C;N;K0.00000000035
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y54;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;K"*+CGDO="
F;P19;FE1G;X10
C;N;K0.00000000035
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y55;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;K"*+CJ="
F;P19;FE1G;X10
C;N;K0.00015
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y56;X1
F;P19;FE1G;X2
F;P19;FE1L;X3
F;P19;FE1G;X4
F;P19;FE1L;X5
F;P19;FE1G;X6
F;P19;FE1L;X7
F;P19;FE1G;X8
```

```
C;K#DIV/0!;E1/R56C6
F;P19;FE1L;X9
C;K"*+CJSW="
F;P19;FE1G;X10
C;N;K0.0000000004
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y57;X1
F;P19;FE1G;X2
F;P19;FE1L;X3
F;P19;FE1G;X4
F;P19;FE1L;X5
F;P19;FE1G;X6
F;P19;FE1L;X7
F;P19;FE1G;X8
C;K#DIV/0!;E1/R57C6
F;P19;FE1L;X9
C;K"*+LD="
F;P19;FE1G;X10
C;N;K0.0000008
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y58;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;K"*+TOX="
F;P19;FE1G;X10
C;N;K0.00000008
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y59;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;K"*"
F;P19;FE1G;X10
F;P19;FE1G;X11
F;P19;FE1G;X12
F;P19;FE1G;X13
F;P19;FE1G;X14
F;P19;FE1G;X15
```

```
F;P19;FE1G;X16
F;P19;FE1G;X17
F;P19;FE1G;X18
F;P19;FE1L;Y60;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;K"*RUN DECK BELOW"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y61;X1
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1L;X9
C;K"*RUN DECK"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y62;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;N;K"*.OPTION LIMPTS=1000"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y63;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;N;K"VIN+ 1 0 DC 0 AC 1.0"
```

F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y64;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;N;K"VDD 8 0 DC 5.0"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y65;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;N;K"VSS 0 9 DC 5.0"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y66;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;N;K"VIN- 2 0 DC 0"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y67;X1
F;P19;FE1G;X2
F;P19;FE1G;X3
F;P19;FE1G;X4

```
F;P19;FE1G;X5
F;P19;FE1G;X6
F;P19;FE1G;X7
F;P19;FE1G;X8
F;P19;FE1L;X9
C;N;K"CL 6 0 20P"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y68;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;N;K".OP"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y69;X1
F;P19;FE1G;X2
F;P19;FE1G;X3
F;P19;FE1G;X4
F;P19;FE1I;X5
F;P19;FE1G;X6
F;P19;FE1G;X7
F;P19;FE1G;X8
F;P19;FE1L;X9
C;N;K".TF V(6) VIN+"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y70;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;N;K".DC VIN+ -0.0005 0.0005 0.0001"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
```

```
F;P19;FE1G;X17
F;P19;FE1G;X18
F;P19;FE1L;Y71;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;N;K"*.PRINT DC V(3)"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y72;X1
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1L;X9
C;N;K".AC DEC 10 1 10MEG"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y73;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;N;K".PROBE"
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y74;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1L;X9
C;N;K".END"
F;P19;FE1G;X10
```

F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y75;X1
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1G;X9
C;N
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y76;X1
F;P19;FE1G;X2
F;P19;FE1L;X3
F;P19;FE1L;X4
F;P19;FE1G;X5
F;P19;FE1G;X6
F;P19;FE1G;X7
F;P19;FE1G;X8
F;P19;FE1G;X9
C;N
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y77;X1
F;P19;FE1G;X2
F;P19;FE1G;X3
F;P19;FE1G;X4
F;P19;FE1G;X5
F;P19;FE1G;X6
F;P19;FE1L;X7
F;P19;FE1L;X8
C;K" "
F;P19;FE1G;X9
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y78;X1
F;P19;FE1G;X2
F;P19;FE1G;X3
F;P19;FE1G;X4
F;P19;FE1G;X5

F;P19;FE1G;X6
F;P19;FE1G;X7
F;P19;FE1G;X8
F;P19;FE1G;X9
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1G;Y79;X1
F;P19;FE1G;X2
F;P19;FE1G;X3
F;P19;FE1G;X4
F;P19;FE1G;X5
F;P19;FE1G;X6
F;P19;FE1G;X7
F;P19;FE1G;X8
F;P19;FE1G;X9
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
F;P19;FE1L;Y80;X1
F;P19;FE1G;X2
F;P19;FE1G;X3
F;P19;FE1G;X4
F;P19;FE1L;X5
F;P19;FE1G;X6
F;P19;FE1G;X7
F;P19;FE1G;X8
F;P19;FE1G;X9
F;P19;FE1G;X10
F;P19;FE1G;X11
F;P19;FE1G;X12
F;P19;FE1G;X13
F;P19;FE1G;X14
F;P19;FE1G;X15
F;P19;FE1G;X16
F;P19;FE1G;X17
F;P19;FE1G;X18
E

What is claimed is:

1. A method for creating a physical layout for an analog integrated circuit, the method comprising the steps of:

specifying the operating characteristics of at least one device module;

developing descriptions of the structure of a desired analog circuit including a plurality of interconnected circuit devices;

developing a set of desired operating parameters associated with said desired analog circuit;

generating a tiling script for assembling a plurality of said device modules into said analog circuit by iteratively:

a) developing a tiling script for assembling said device modules into a circuit using said descriptions of said desired analog circuit, said set of desired operating parameters and said at least one device module;

b) calculating the operating specifications of the circuit produced by said filing script;

c) comparing the calculated operating specifications against said desired operating parameters; and d) repeating steps a, b and c until said calculated operating specifications and said desired operating parameters are sufficiently related;

generating an interconnect script for interconnecting said plurality of device modules; and assembling said plurality of device modules into said desired analog circuit according to said tiling script and said interconnect script.

2. A method as recited in claim 1 wherein said step of developing specifications of at least one device module includes the development of a library of different device modules.

3. A method as recited in claim 2 wherein said iterative generation of said tiling script is performed within a computerized spreadsheet program.

4. A method as recited in claim 3 wherein said determination of said operating specifications of said desired analog circuit and said generating of said interconnect script is performed within said computerized spreadsheet program.

5. A method as recited in claim 1 wherein said desired operating parameters include the operating parameters of at least some of the circuit devices within the analog circuit.

6. A method as recited in claim 1 wherein said desired operating parameters include at least some of the operating parameters of said analog circuit taken as a whole.

7. A method for creating a physical layout for an analog integrated circuit, the method comprising the steps of:

(a) providing an empty netlist of analog circuit specifications for any device module included in the circuit specifications;

(b) providing a general device module design for each device module included in the circuit specifications;

(c) providing a list of desired device operating parameter values for each device module included in the circuit specifications as inputs to a computerized spreadsheet program that accepts and stores such parameter values;

(d) providing, within the spreadsheet program, a plurality of circuit equations that describe the electrical response of the analog circuit to be created;

(e) providing, within the spreadsheet program, device module specifications and the general device module design for each device module included in the circuit specifications;

(f) generating a tiling script for assembling the device modules included in the circuit specifications in a circuit specified by the circuit specifications;

(g) comparing the design response of a circuit that incorporates the device modules included in the circuit specifications with a desired circuit response, using a circuit simulator that takes account of the circuit equations, the device module specifications and general device module design for each device module included in the circuit specifications;

(h) if the design circuit response differs from the desired circuit response by more than a predetermined amount, repeating steps (c)-(h) until the difference between design circuit response and desired circuit response is less than the predetermined amount;

(i) positioning each device module included in the circuit specifications on the design circuit according to the tiling script;

(j) generating an interconnect script that specifies a set of electrical connections between each device module included in the circuit specifications, each input terminal and output terminal of the design circuit, and any other device module included in the circuit specifications; and (k) assembling the device modules included in the circuit specifications and the electrical connections sets to form an analog circuit.

8. The method as recited in claim 7, wherein said step of providing specifications for each device module included in the circuit specifications comprises development of a library of device module specifications and provision of specifications for each device module included in the circuit specifications from this library.

* * * * *